United States Patent
Parker et al.

(10) Patent No.: US 9,804,211 B2
(45) Date of Patent: Oct. 31, 2017

(54) INDICATORS FOR A POWER METER

(71) Applicant: Veris Industries, LLC, Tualatin, OR (US)

(72) Inventors: Aaron Parker, Happy Valley, OR (US); Martin Cook, Tigard, OR (US)

(73) Assignee: Veris Industries, LLC, Tualatin, OR (US)

( * ) Notice: Subject to any disclaimer, the term of this patent is extended or adjusted under 35 U.S.C. 154(b) by 0 days.

(21) Appl. No.: 15/185,824

(22) Filed: Jun. 17, 2016

(65) Prior Publication Data

US 2017/0242059 A1    Aug. 24, 2017

Related U.S. Application Data

(60) Provisional application No. 62/296,817, filed on Feb. 18, 2016.

(51) Int. Cl.
| | | |
|---|---|---|
| *G01R 19/00* | (2006.01) | |
| *G01R 21/133* | (2006.01) | |
| *G01R 21/00* | (2006.01) | |
| *G01R 27/26* | (2006.01) | |
| *G01R 21/06* | (2006.01) | |

(52) U.S. Cl.
CPC ......... *G01R 21/133* (2013.01); *G01R 21/006* (2013.01); *G01R 21/06* (2013.01); *G01R 27/2688* (2013.01); *G01R 19/0084* (2013.01); *G01R 19/0092* (2013.01)

(58) Field of Classification Search
CPC ............... G01R 19/00; G01R 19/0084; G01R 19/0092; G01R 19/2513; G01R 15/00; G01R 15/14; G01R 15/20; G01R 15/202; G01R 21/00; G01R 21/001; G01R 21/005; G01R 21/00606; G01R 21/08; G01R 22/00; G01R 25/00; G01R 25/005; G01R 27/00; G01R 27/02; G01R 27/26; G01R 27/2688; G01R 27/2694; G01R 21/133
USPC ..... 324/76.11, 103 R, 140 R, 142, 522, 713; 702/1, 57, 60, 61, 64, 62
See application file for complete search history.

(56) References Cited

U.S. PATENT DOCUMENTS

| | | | | |
|---|---|---|---|---|
| 5,994,892 A | * | 11/1999 | Turino | G01D 4/004 324/142 |
| 6,745,138 B2 | * | 6/2004 | Przydatek | G01D 4/004 702/57 |
| 7,502,698 B2 | * | 3/2009 | Uenou | G01R 21/133 324/141 |
| 2002/0014887 A1 | * | 2/2002 | Lewis | G01R 21/133 324/107 |
| 2007/0296400 A1 | * | 12/2007 | Andoh | G01R 31/2839 324/142 |
| 2013/0158910 A1 | * | 6/2013 | Chuang | G01R 21/133 702/62 |

\* cited by examiner

*Primary Examiner* — Hoai-An D Nguyen
(74) *Attorney, Agent, or Firm* — Chernoff Vilhauer McClung & Stenzel, LLP

(57) ABSTRACT

A system for indicators of power meters.

9 Claims, 13 Drawing Sheets

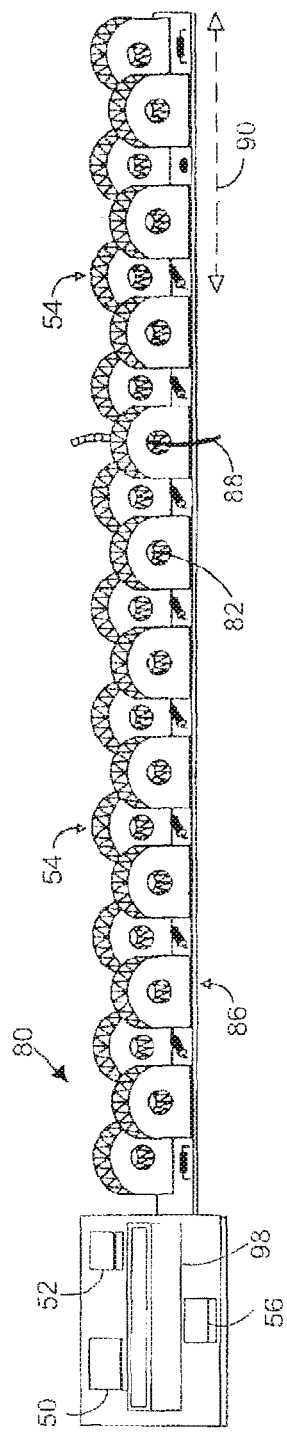
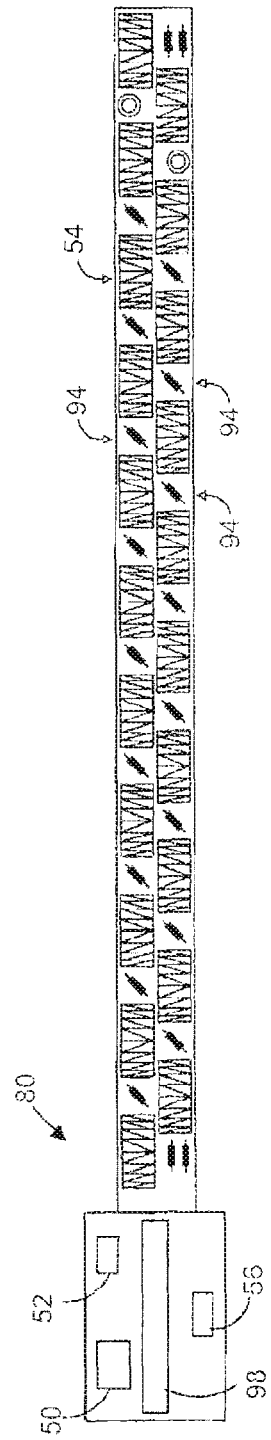
FIG. 2
FIG. 3

INDICATORS FOR A POWER METER

CROSS-REFERENCE TO RELATED APPLICATIONS

This application claims the benefit of U.S. Provisional App. No. 62/296,817, filed Feb. 18, 2016.

BACKGROUND OF THE INVENTION

The present invention relates to indicators for a power meter.

The total power consumption of a building or other facility is monitored by the electric utility with a power meter located between the utility's distribution transformer and the facility's power distribution panel. However, in many instances it is desirable to sub-meter or attribute the facility's power usage and cost to different occupancies, buildings, departments, or cost centers within the facility or to monitor the power consumption of individual loads or groups of loads, such as motors, lighting, heating units, cooling units, machinery, etc. These single phase or multi-phase electrical loads are typically connected to one or more of the branch circuits that extend from the facility's power distribution panel. While a power meter may be installed at any location between a load and the distribution panel, it is often advantageous to install a power meter capable of monitoring a plurality of circuits proximate the power distribution panel to provide centralized monitoring of the various loads powered from the panel.

Digital branch current monitors may incorporate data processing systems that can monitor a plurality of circuits and determine a number of parameters related to electricity consumption by the individual branch circuits or groups of circuits. A branch current monitor for measuring electricity consumption by respective branch circuits comprises a plurality of voltage and current transducers that are periodically read by the monitor's data processing unit which, in a typical branch current monitor, comprises one or more microprocessors or digital signal processors (DSP). For example, a branch current monitor from Veris Industries, Inc. enables up to ninety circuits to be monitored with a single meter and utilizes the MODBUS® RTU network communication interface to enable remote monitoring as part of a building or facility management system. The data processing unit periodically reads and stores the outputs of the transducers quantifying the magnitudes of current and voltage samples and, using that data, calculates the current, voltage, power, and other electrical parameters, such as active power, apparent power and reactive power that quantify the distribution and consumption of electricity. The calculated parameters are typically output to a display for immediate viewing or transmitted from the meter's communication interface to another data processing system, such as a building management computer for remote display or further processing, for example formulating instructions to the facility's automated equipment.

The voltage transducers of digital branch current monitors commonly comprise a voltage divider network that is connected to a conductor in which the voltage will be measured. The power distribution panel provides a convenient location for connecting the voltage transducers because typically each phase of the electricity is delivered to the power distribution panel on a separate bus bar and the voltage and phase is the same for all loads attached to the respective bus bar. Interconnection of a voltage transducer and the facility's wiring is facilitated by wiring connections in the power distribution panel, however, the voltage transducer(s) can be connected anywhere in the wiring that connects the supply and a load, including at the load's terminals.

The current transducers of digital power meters typically comprise current transformers that encircle each of the power cables that connect each branch circuit to the bus bar(s) of the distribution panel. Bowman et al., U.S. Pat. No. 6,937,003 B2, discloses a branch current monitoring system that includes a plurality of current transformers mounted on a common support facilitating installation of a branch current monitor in a power distribution panel. Installation of current transformers in electrical distribution panels is simplified by including a plurality of current transformers on a single supporting strip which can be mounted adjacent to the lines of circuit breakers in the panel. The aforementioned branch current monitor from Veris Industries, Inc. is commonly used to monitor up to four strips of current sensors; each comprising 21 current transformers on a common support. In addition, the branch current monitor provides for eight auxiliary current transformer inputs for sensing the current flow in two 3-phase mains with two neutrals and six voltage connections enabling voltage sensing in six bus bars of two 3-phase mains. However, the measurements for each of the single, two, or three phase circuits provide erroneous results if the respective current and voltage phases are not properly aligned with one another.

Power metering devices tend to be effective if the current and voltage phases are properly aligned. However, when the current and voltage phases are improperly aligned with one another, such as the current phases of two phases are switched with one another, it is desirable to be able to effectively determine whether such an improper interconnection exists and further determine the nature of such an improper interconnection.

What is desired, therefore, is a power metering system that can provide an indication of an improper interconnection and/or determine the nature of such an improper interconnection.

BRIEF DESCRIPTION OF THE DRAWINGS

FIG. 2 is a perspective view of a current transformer strip for a branch current monitor.

FIG. 3 is a top view of the current transformer strip of FIG. 2.

DETAILED DESCRIPTION OF PREFERRED EMBODIMENTS

Figure 1:
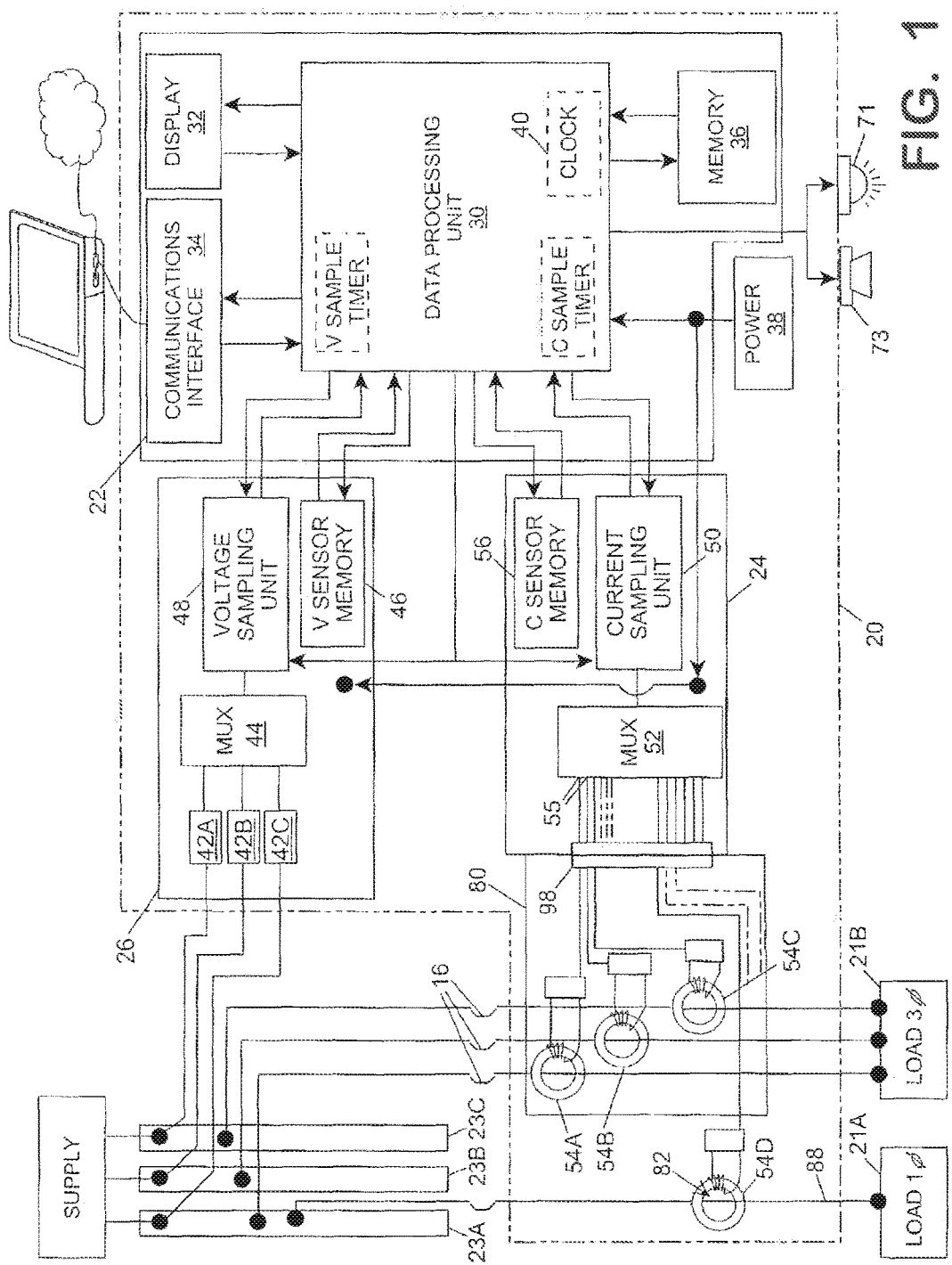
FIG. 1 is a block diagram of an exemplary branch current monitor.

Referring in detail to the drawings where similar parts are identified by like reference numerals, and, more particularly to FIG. 1, a branch current monitor 20 arranged to monitor the voltage and current in a plurality of branch circuits comprises, generally, a data processing module 22, a current module 24 and a voltage module 26. The branch current monitor 20 is preferably housed in a housing and/or the data processing module 22 is preferably housed in a housing and/or the current module 24 is preferably housed in a housing and/or the voltage module is preferably housed in a housing. In some embodiments, the branch current monitor and/or the data processing module and/or the current module and/or the voltage module includes one or more connectors suitable to detachably connect a separate power meter to sense electrical properties of the branch current monitor and/or the data processing module and/or the current module and/or the voltage module. The data processing module 22 comprises a data processing unit 30 which, typically, comprises at least one microprocessor or digital signal processor (DSP). The data processing unit 30 reads and stores data received periodically from the voltage module and the current module, and uses that data to calculate the current, voltage, power and other electrical parameters that are the meter's output. The resulting electrical parameters may be output to a display 32 for viewing at the meter or output to a communications interface 34 for transmission to another data processing system, such as a building management computer, for remote display or use in automating or managing facility functions. The data processing module may also include a memory 36 in which the programming instructions for the data processing unit and the data manipulated by the data processing unit may be stored. In addition, the branch current monitor typically includes a power supply 38 to provide power to the data processing unit and to the voltage and current modules.

The voltage module 26 includes one or more voltage transducers 42 each typically comprising a resistor network, a voltage sampling unit 48 to sample the output of the voltage transducers and convert the analog measurements to digital data suitable for use by the data processing unit and a multiplexer 44 that periodically connects the voltage sampling unit to selected ones of the voltage transducers enabling periodic sampling of the magnitude of the voltage at each of the voltage transducers. Typically, each phase of the electricity supplied to a distribution panel is connected to a bus bar 23 to which are connected the circuit breakers 16 that provide a conductive interconnection to each of the respective loads, by way of examples, a single-phase load 21A and a three-phase load 21B. Since the voltage and phase supplied to all commonly connected loads is the same, a meter for measuring three-phase power typically includes three voltage transducers 42A, 42B, 42C each connected to a respective bus bar 23A, 23B, 23C. A clock 40, which may be included in the data processing unit, provides periodic timing signals to trigger sampling of the outputs of the voltage transducers by the voltage sampling unit. The voltage module may also include a voltage sensor memory 46 in which voltage sensor characterization data, including relevant specifications and error correction data for the voltage transducers are stored. If a portion of the voltage module requires replacement, a new voltage module comprising a voltage sensor memory containing sensor characterization data for the transducers of the new module can be connected to the data processing unit. The data processing unit reads the data contained in the voltage sensor memory and applies the sensor characterization data when calculating the voltage from the transducer data output by the replacement voltage module.

The current module 24 typically comprises a current sampling unit 50, a multiplexer 52 and a plurality of current transducers 54 communicatively connected to respective sensor positions 55 of the current module. The multiplexer 52 sequentially connects the sampling unit to the respective sensor positions enabling the sampling unit to periodically sample the output of each of the current transducers 54. The current sampling unit comprises an analog-to-digital converter to convert the analog sample at the output of a current transducer selected by the multiplexer, to a digital signal for acquisition by the data processing unit. The clock 40 also provides the periodic timing signal that triggers sampling of the current transducer outputs by the current sampling unit. The current module may also include a current sensor memory 56 in which are stored characterization data for the current transducers comprising the module. The characterization data may include transducer identities; relevant specifications, such as turns ratio; and error correction factors, for examples equations or tables enabling the phase and ratio errors to be related to a current permitting correction for magnetization induced errors. The characterization data may also include the type of transducers, the number of transducers, the arrangement of transducers and the order of the transducers' attachment to the respective sensor positions of the current module. At start up, the data processing unit queries the current sensor memory to obtain characterization data including error correction factors and relevant specifications that are used by the data processing unit in determining the monitor's output.

Figure 4:
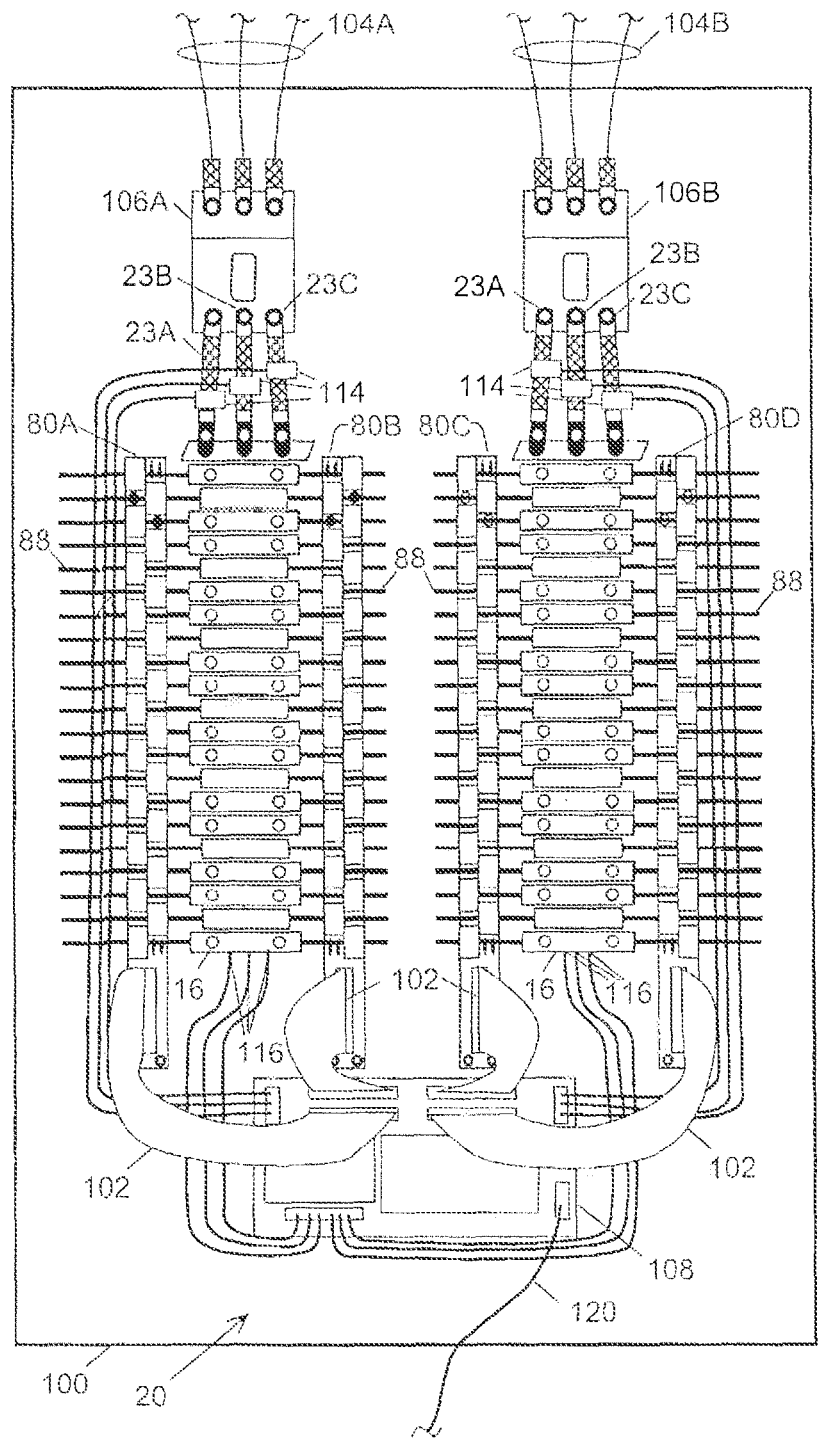
FIG. 4 is a front view of an exemplary electrical distribution panel and branch current monitor.

Referring also to FIGS. 2, 3, and 4, monitoring current in a plurality of branch circuits requires a plurality of current transducers, each one encircling one of the branch power cable(s) 88 that connect the power distribution panel to the load(s) of the respective branch circuit. Current sensing may be performed by an individual current sensor, such as the current transformer 54D, which is connected to the current module. On the other hand, a branch current monitor may comprise one or more sensor strips 80 each comprising a plurality of current sensors attached to a common support, such as sensors 54A, 54B, 54C. The sensors 54 are preferably current transformers but other types of sensors may be used, inclusive of split-core transformers. Each current transformer comprises a coil of wire wound on the cross-section of a toroidal metallic or non-metallic core. The toroidal core is typically enclosed in a plastic housing that includes an aperture 82 enabling the power cable 88 to be extended through the central aperture of the core. The openings 82 defined by the toroidal cores of the transformers are preferably oriented substantially parallel to each other and oriented substantially perpendicular to the longitudinal axis 90 of the support 86. To provide a more compact arrangement of sensors, the sensors 54 may be arranged in substantially parallel rows on the support and the housings of the sensors in adjacent rows may be arranged to partially overlap in the direction of the longitudinal axis of the support. To facilitate routing the power cables of the branch circuits through the cores of the current transformers, the common support maintains the current transformers in a fixed spatial relationship that preferably aligns the apertures of the toroidal coils directly opposite the connections of the power cables 88 and their respective circuit breakers 16 when the strip is installed in a distribution panel 100. For protection from electrical shock, a transient voltage suppressor 94 may be connected in parallel across the output terminals of each sensor to limit the voltage build up at the terminals when the terminals are open circuited.

The transducer strip 80 may include the current sensor memory 56 containing characterization data for the current transformers mounted on the support 86. The current sensor memory may also include characterization data for the transducer strip enabling the data processing unit to determine whether a transducer strip is compatible with the remainder of the meter and whether the strip is properly connected to the data processing module. Improper connection or installation of an incompatible transducer strip may cause illumination of signaling lights or a warning message on the meter's display. In addition, the transducer strip 80 may comprise a current module of the power meter with one or more current transformers 54, the multiplexer 52, the current sampling unit 50 and the current sensor memory all mounted on the support 86. A connector 98 provides a terminus for a communication link 102 connecting the current transducer strip (current module) to the data processing module 22.

The branch current monitor may also include one or more errant current alarms to signal an operator or data processing system that manages the facility or one or more of its operations of an errant current flow in one of the monitored branch circuits. When a current having a magnitude greater or lesser than a respective alarm current limit is detected in one of the branch circuits an alarm annunciator is activated to notify the operator or another data processing system of the errant current flow. An alarm condition may be announced in one or more ways, including, without limitation, periodic or steady illumination of a light 71, sounding of an audible alarm 73, display of a message on the meter's display 32 or transmission of a signal from the communications interface 34 to a remote computer or operator.

A commercial power distribution panel commonly supplies a substantial number of branch circuits and a branch current monitor for a distribution panel typically includes at least an equal number of current transformers. Referring to FIG. 4, an exemplary electrical distribution panel includes two three-phase mains 104A, 104B which respectively are connected to main circuit breakers 106A, 106B. Each of the phases of each main is connected to a bus bar 23A, 23B, 23C. The three bus bars extend behind each of two rows of branch circuit breakers 16 that respectively conductively connect one of the bus bars to a conductor 54 that conducts current to the branch circuit's load(s). A single phase load is connected to single bus bar, a two-phase load is typically connected to two adjacent circuit breakers which are connected to respective bus bars and a three-phase load is typically connected to three adjacent circuit breakers which are each connected to one of the three bus bars. Typically, a two-phase load or three phase load is connected to the appropriate number of adjacent circuit breakers in the same row. The exemplary distribution panel has connections for 84 branch circuit conductors which can be monitored by a branch current monitor produced by Veris Industries, Inc. The branch current monitor monitors the current, voltage and energy consumption of each circuit of the distribution panel, including the mains. The accumulated information can be transmitted to a remote consumer through a communications interface or viewed locally on a local display. Data updates occur approximately every two seconds and as a circuit approaches user configured thresholds, alarms are triggered by the monitor.

As illustrated in FIG. 4, the main acquisition circuit board 108 of the branch current monitor 20 is connectable to as many as four current transformer strips or support units 80A, 80B, 80C, 80D each supporting 21 current transformers. The transformers of the support units are connectable to the data processing unit of the branch current monitor by communication links 102 comprising multi-conductor cables. In addition, the branch current monitor includes connections for six auxiliary current transformers 114 which are typically used to monitor the current in the mains. Since the voltage and phase are common for all loads connected to a bus bar, the branch current monitor also includes six voltage connections 116. A data channel 120 connected to the communications interface enables transmission of data captured by the branch current monitor to other data processing devices that are part of a building management system or other network. The main acquisition circuit board 108 is preferably housed in a housing. In some embodiments, the main acquisition circuit board 108 includes one or more connectors suitable to detachably connect a separate power meter to sense electrical properties of the current and/or voltage being sensed. The strips or support units may be housed in a housing, in whole or in part. In some embodiments, the strips or support units includes one or more connectors suitable to detachably connect a separate power meter to sense electrical properties of the current and/or voltage being sensed.

The branch current monitor is installed in the distribution panel by mounting the current transformer strips to the panel adjacent to the rows of circuit breakers and by passing each of the branch circuit conductors 88 through a central aperture in one of the toroidal current transformers and connecting the conductors to the respective circuit breakers. The main acquisition board 108 is attached to the electrical panel and the multi-conductor cables 102 are connected to the board. The main acquisition board 108 is preferably housed in a housing. The mains conductors are passed through the apertures in the auxiliary current transformers and the auxiliary current transformers are connected to the main acquisition board. The voltage taps are connected to respective bus bars and to the main acquisition board. The data channel 120 is connected and the branch current monitor is ready for configuration.

Figure 5:
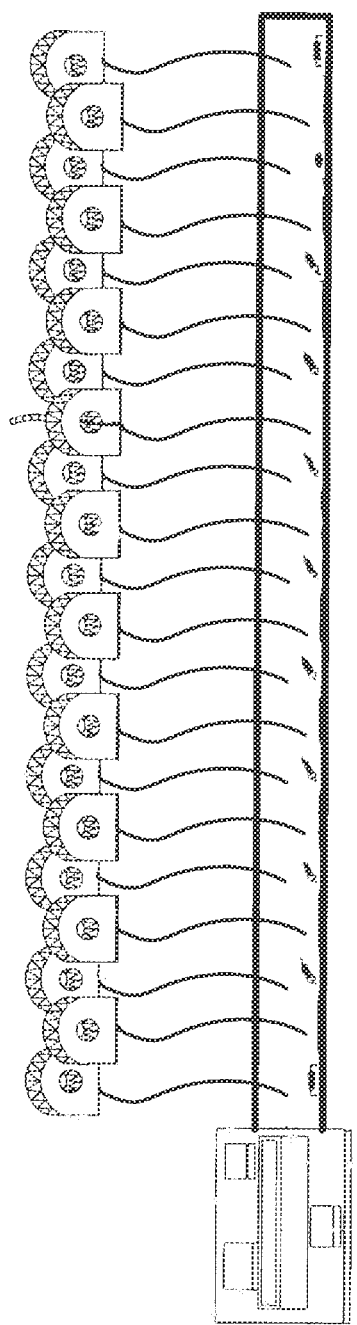
FIG. 5 illustrates a perspective view of another current transformer strip for a branch current monitor.

Referring to FIG. 5, in another embodiment, the strip unit may include a set of connectors at each general location a current sensor is desired. A current transformer may be included with a flexible wire within a connector at the end thereof and a connector on the strip unit. The current transformer is then detachably connectable to the connector of the strip unit. The current transformer may include a solid core or a split core, which is more readily interconnected to existing installed wires. If desired, the strip unit may include one or more power calculation circuits supported thereon. For example, the data from the current transformers may be provided to the one or more power calculation circuits supported thereon together with the sensed voltage being provided by a connector from a separate voltage sensor or otherwise voltage sensed by wires interconnected to the strip unit or signal provided thereto. As a result of this configuration, the connector may provide voltage, current, power, and other parameters to the circuit board. All or a portion of the strip unit is preferably housed in a housing. The strips unit may be housed in a housing, in whole or in part. In some embodiments, the strip unit includes one or more connectors suitable to detachably connect a separate power meter to sense electrical properties of the strip unit.

Figure 6:
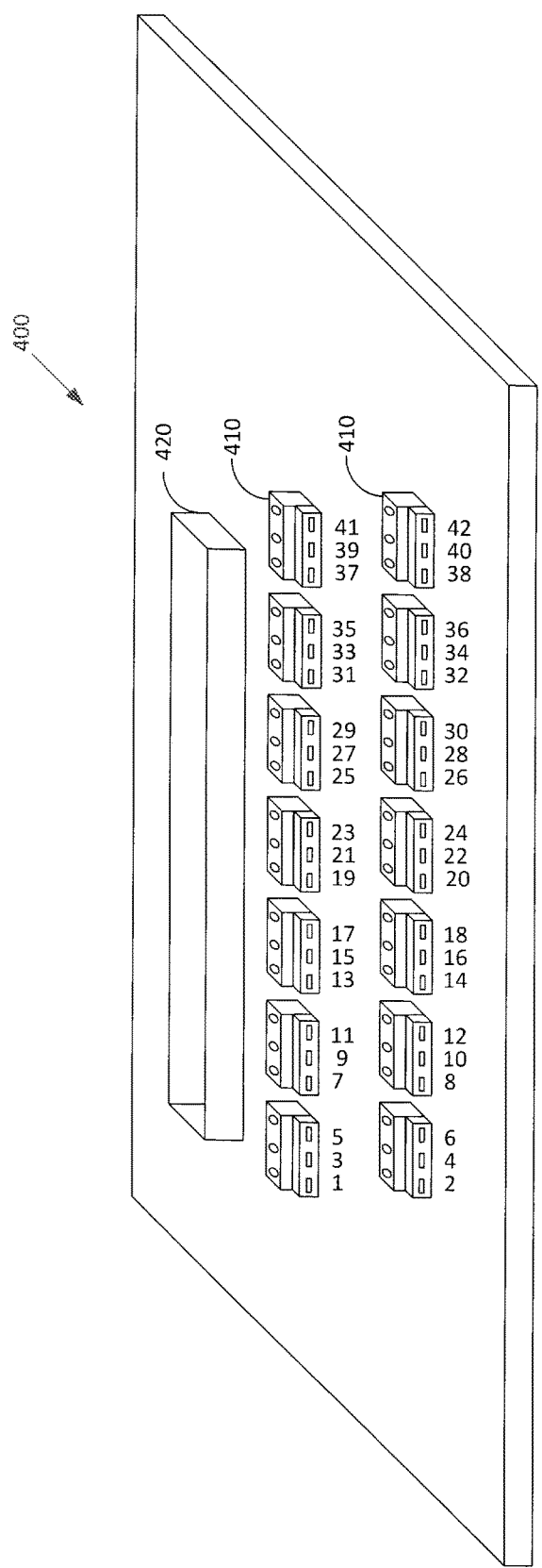
FIG. 6 illustrates a view of a connector board for a branch current monitor.

Referring to FIG. 6, another embodiment includes a set of one or more connector boards 400 in addition to or as an alternative to the strip units. Each of the connector boards may include a set of connectors 410 that may be used to interconnect a current transformer thereto. Each of the connector boards may include a connector 420 that interconnects the connector board to the circuit board 108. Each of the connector boards may be labeled with numbering, such as 1 through 14 or 1 through 42, and 15 through 28 or 42 through 84. Often groups of three connectors are grouped together as a three phase circuit, thus connectors 1 through 42 may be 14 three phase circuits. For example, the connector board with the number of 1 through 14 may be intended to be connected to connector A. For example, the connector board with the numbers of 15 through 28 may be intended to be connected to connector B. All or a portion of the connector board is preferably housed in a housing. In some embodiments, the connector board includes one or more connectors suitable to detachably connect a separate power meter to sense electrical properties of the connector board.

Figure 7:
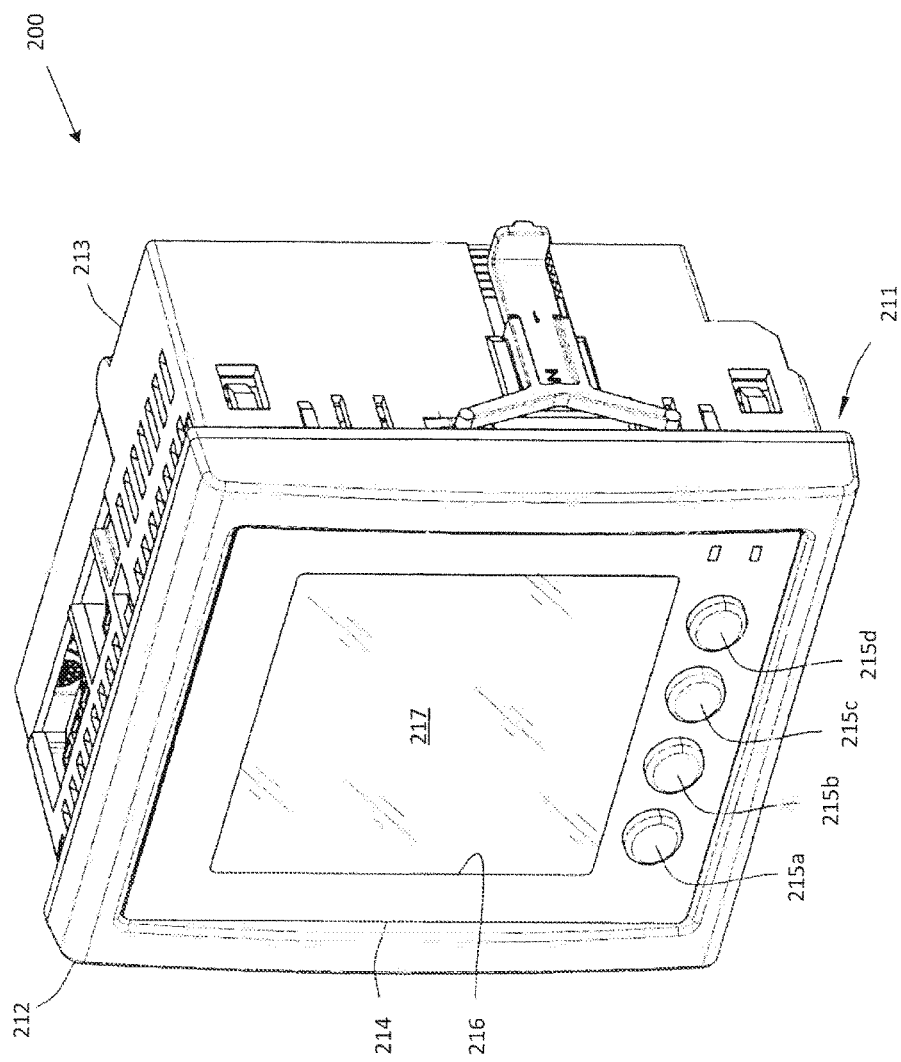
FIG. 7 illustrates an exemplary embodiment of a power meter.
Figure 8:
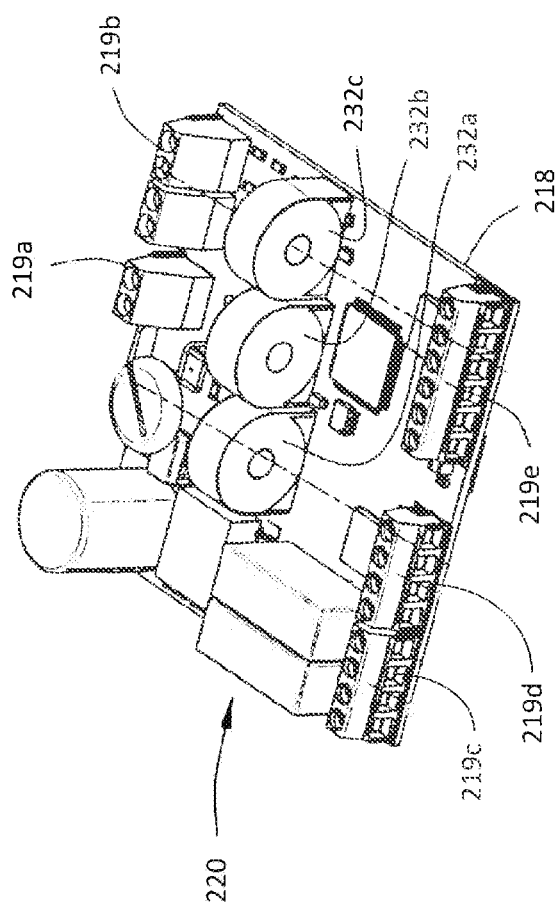
FIG. 8 illustrates a circuit board included within the power meter of FIG. 7.

Referring to FIG. 7, another embodiment of a power meter 200 is housed in a housing 211 formed by a front bezel 212 and a back cover 213 that snap together. The front bezel 212 may be bonded to a user-interface panel 214 that contains four manually operable pushbuttons 215a-215d and a central window 216 for viewing a display 217, such as an LCD, attached to the bezel 212. Behind the display 217 is a printed circuit board 218 (see FIG. 8) that has multiple terminal blocks 219a-219e and associated circuitry 220 mounted on one or both sides of the board 218. The terminal blocks 219a and 219b are used to connect the circuitry 220 to a control power supply and voltage input lines, respectively. For example, the voltage lines may be from the power panel or from the wire to the load(s). In addition the same voltage lines, for example from the power panel or the wire to the load, may further be extended to pass through a respective current transformer to sense the current therein. Also, a respective current sensor of a set of one or more current transformers may encircle a respective wire to a load, where the wires from the respective current transformer being interconnected to suitable terminals of one or more of the terminal blocks. In this manner, the power meter is capable of sensing or otherwise receiving signals representative of the voltage and current in the wires to the load(s). Terminal block 219c may be used to connect digital outputs of the circuitry 220, such as demand sync signals, alarm signals or external control signals, to relays, motors, meters or other devices. Terminal block 129d may be an RS485 port used for communicating with a monitoring and control system and can be daisy chained to multiple devices. Terminal block 219e may be used to receive digital inputs for determining circuit breaker status, counting pulses, counting motor starts, accepting demand sync pulses, and/or input metering. The terminal blocks 219a-219e and the circuitry 220 (simplified for purposes of illustration) may be used to monitor either a single-phase, a two-phase, and/or a three-phase electrical power distribution system. Typically the meter is used to measure currents and voltages and report in real time their root-mean-square values, which includes values for all three phases and neutral in the case of a three-phase power distribution system. The meter also typically calculates power factor, real power, reactive power and other electrical parameters. In some embodiments, the housing 211 includes one or more connectors suitable to detachably connect a separate power meter to sense electrical properties of the current and/or voltage being sensed.

Figure 9:
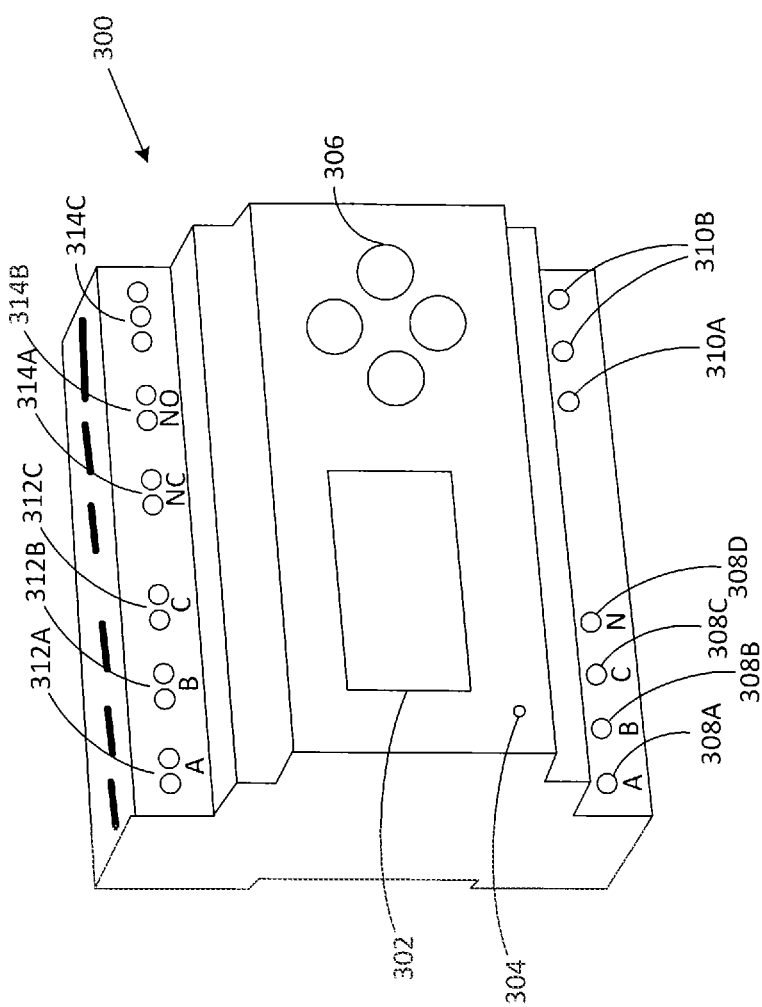
FIG. 9 illustrates another exemplary embodiment of a power meter.

Referring to FIG. 9, another embodiment of a power meter 300 housed within a housing suitable to be mounted to a standard 35 mm DIN rail or screw-mounted to the interior surface of an enclosure. The power meter 300 may include an alphanumeric display 302 to display information, such as power usage and the type thereof. The power meter 300 may include an alarm light 304 when an alarm condition occurs. The power meter 300 may include a set of configuration buttons 306. The power meter may include a set of voltage inputs, such as voltage A 308A, voltage B 308B, voltage C 308C, and voltage neutral 308D. The power meter 300 may also include an earth ground 310A and control power 310B. The power meter 300 may sense the current by using current transformers that are respectively interconnected to current sensor input phase A 312A, current sensor input phase B 312B, and/or current sensor input phase C 312C. The power meter 300 may have a set of outputs, such as a normally closed phase loss alarm 314A, a normally open pulse output representative of energy usage 314B, and other outputs 314C. In some embodiments, the power meter 300 includes one or more connectors suitable to detachably connect a separate power meter to sense electrical properties of the current and/or voltage being sensed.

Figure 10:
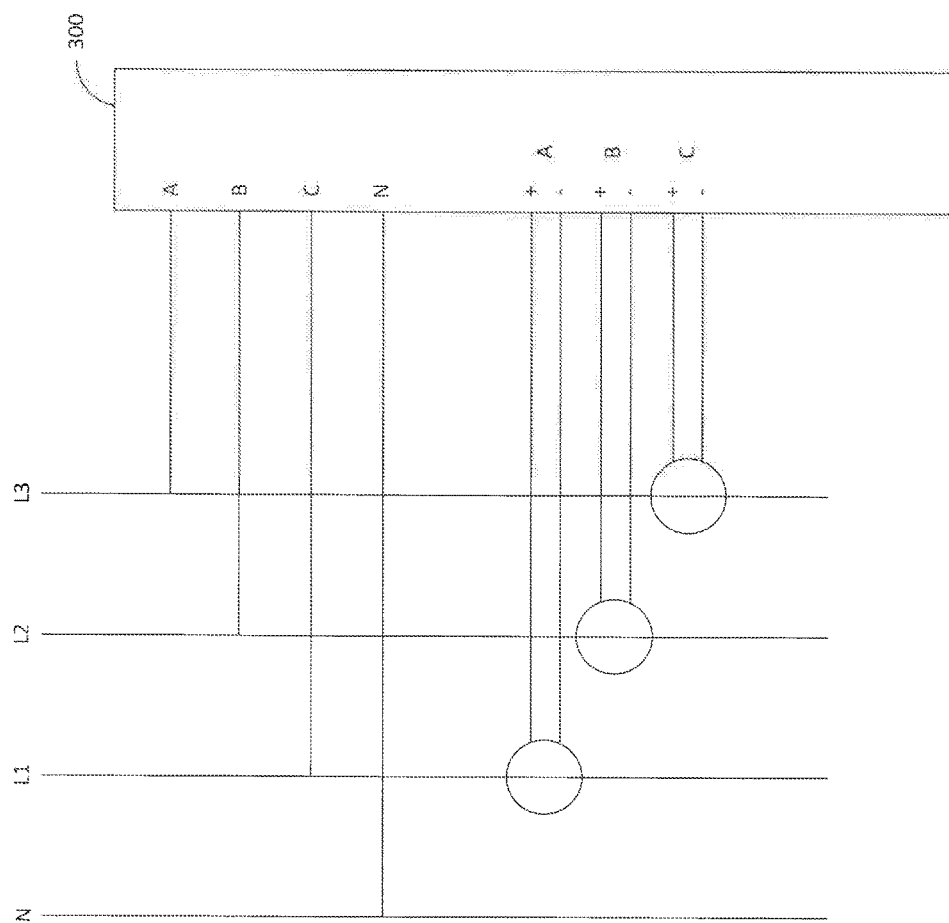
FIG. 10 illustrates one manner of wiring a power meter for sensing voltage and current.

Referring to FIG. 10, an exemplary wiring diagram for a 3-phase 3-wire current transformer with a neural is illustrated. By way of example, the power meter may determine one or more of the following electrical parameters for one or more phases of the input, such as real energy, total instantaneous real power, total instantaneous reactive power, total instantaneous apparent power, total power factor, voltage L-L, voltage average, voltage L-N, current, real power, power factor, voltage phases A-B/B-C/A-C/A-N/B-N/C-N, instantaneous current, frequency, apparent energy consumption, reactive energy consumption, apparent power, reactive power, total real power, total reactive power, total apparent power, etc.

In some embodiments, the power meter may be electrically connected in series with the loads, if desired. As illustrated in FIG. 1 through FIG. 10, the power meter may be in many different configurations and form factors. All or portions of the power meter is preferably housed in a housing. Whether housed in a housing or not housed in a housing, all or portions of the power meter preferably include one or more connectors suitable to detachably connect a separate power meter to sense electrical properties of the power meter, such as the voltage and/or current so that the additional power meter may determine power measurements.

Figure 11:
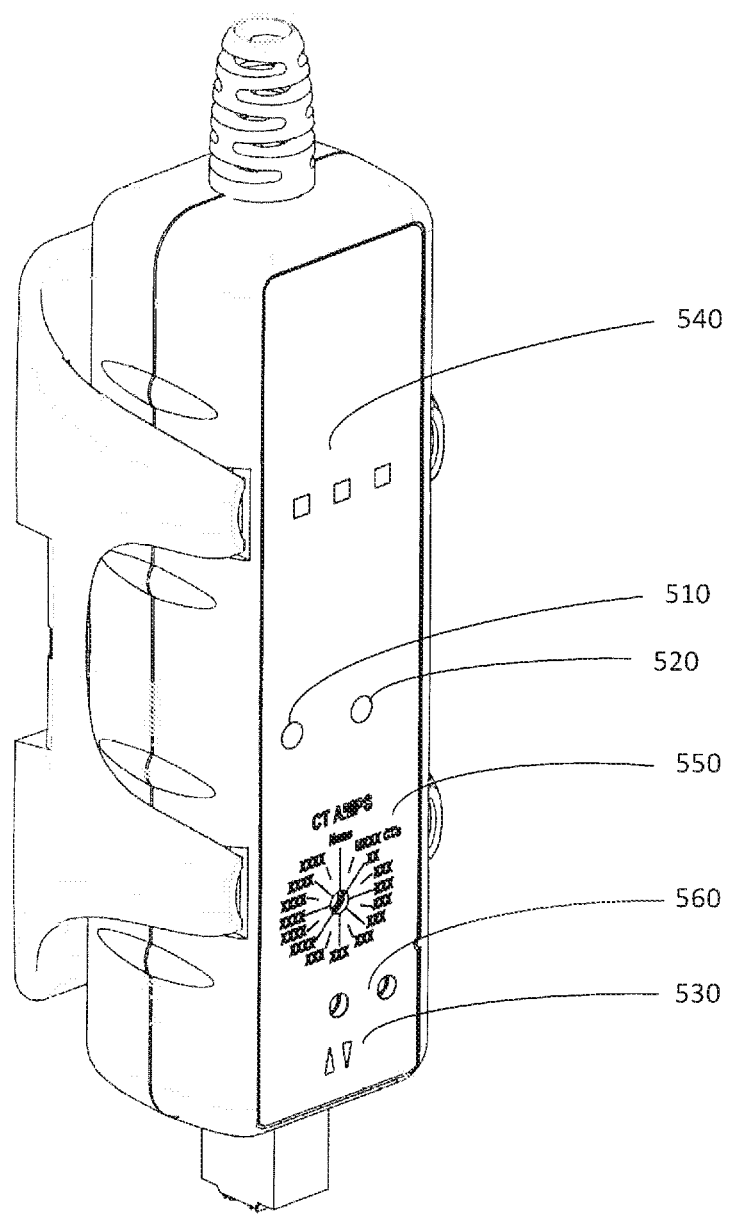
FIG. 11 illustrates another exemplary embodiment of a power meter.
Figure 12:
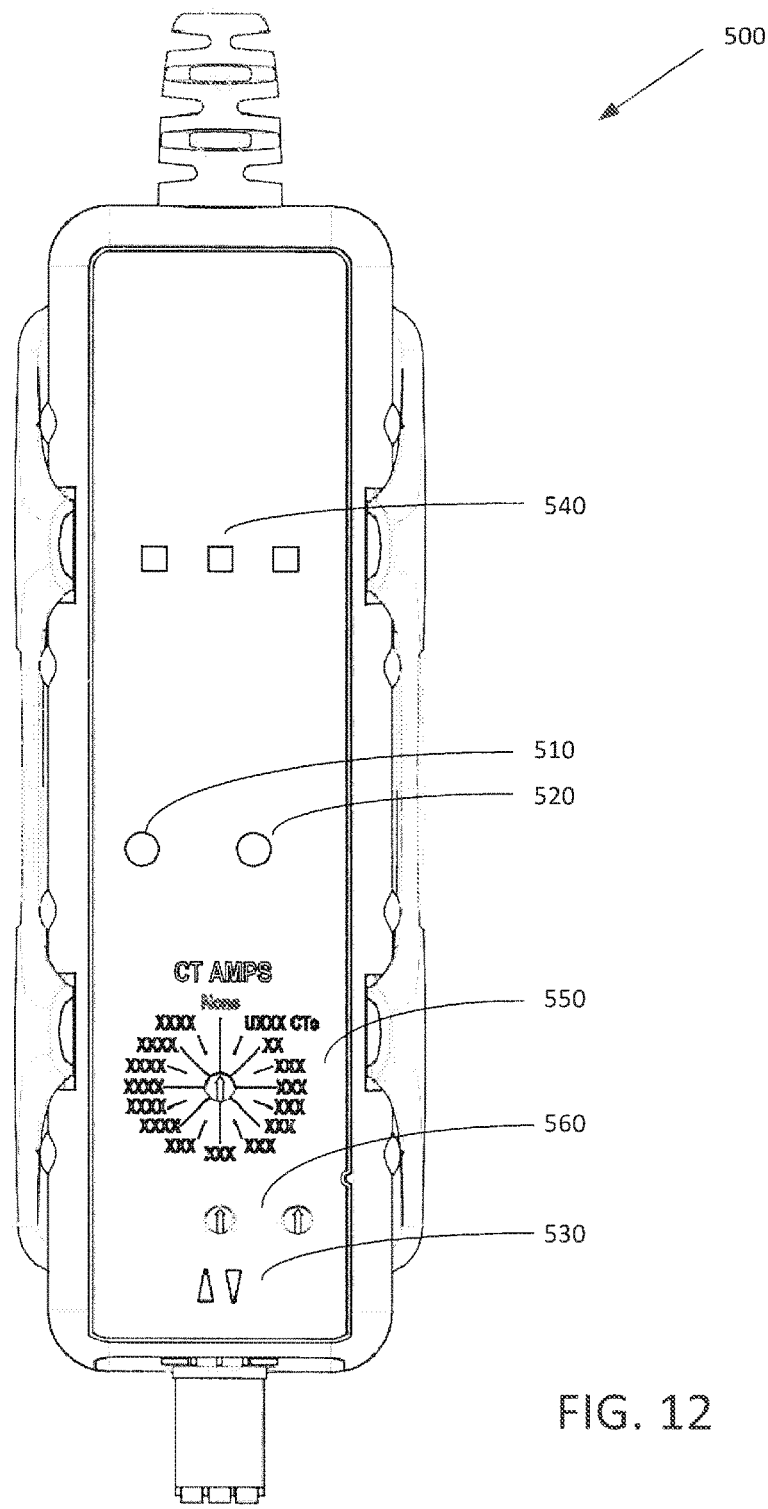
FIG. 12 illustrates another exemplary embodiment of a power meter.

Referring to FIG. 11 and FIG. 12, another embodiment of a power meter 500 is illustrated. The power meter 500 may include a meter status 510, which may be a multi-colored light emitting diode. A green output for the meter status 510 may indicate normal operation. A red output for the meter status 510 may indicate an error condition. An alternating red and green output for the meter status 510 may indicate a firmware download mode to the power meter 500. The power meter 500 may include a settings override 520, which may be a light emitting diode. An off light for the settings override 520 may indicate the meter is operating normally with the parameters as set on the front panel of the power meter 500. An on light for the settings override 520 may indicate that one or more of the user interface controls (e.g., rotary dials) on the meter has been overridden through the communications. In this manner, the user may be readily aware that the rotary dials on the front of the meter are no longer necessarily accurate. The power meter 500 may include a communications status 530, which may be a multi-colored light emitting diode and a pair of indicators. One of the indicators may be an upwardly facing triangle and the other indicator may be a downwardly facing triangle. A yellow output of the upwardly facing triangle may indicate that the meter is in an auto-baud mode and has not yet locked onto a baud rate, parity, and protocol. A red output of the upwardly facing triangle may indicate that the meter has received a communication error, such as a bad CRC or framing error. A green output of the upwardly facing triangle may indicate that the meter has received a valid frame. A green output of the downwardly facing error may indicate that the meter is transmitting. The power meter 500 may include a phase status 540, which may be multi-colored light emitting diodes. The number of blinks between pauses indicated the power factor in tenths. For example, a blink count of 7 would be a power factor of approximately 0.70 (in the range of 0.65 and 0.75). The phase status 540 may include a set of three light emitting diodes, namely a first one for line 1 (left side), a second one for line 2 (middle one), and a third one for line 3 (right side). Illumination of one of the light emitting diodes with green indicates a power factor greater than 0.70 for the respective diode. Illumination of one of the light emitting diodes with yellow indicates a power factor less than 0.70 but greater than 0.50 for the respective diode. Illumination of one of the light emitting diodes with a red indicates a power factor less than 0.50 for the respective diode. The phase status 540 may also blink to indicate whether power is being imported (i.e. taken from the grind) by a blink of ¾ of a second, or whether power is being exported (i.e. sent to the grid) by a blink of ¼ of a second). The length of a blink may also indicate that a current transformer has been installed incorrectly. If two phases have a long blink and one phase has a short blink and power is being pulled from the grid, this indicates that a current transformer on the phase with the short blink is likely installed backwards.

Figure 13:
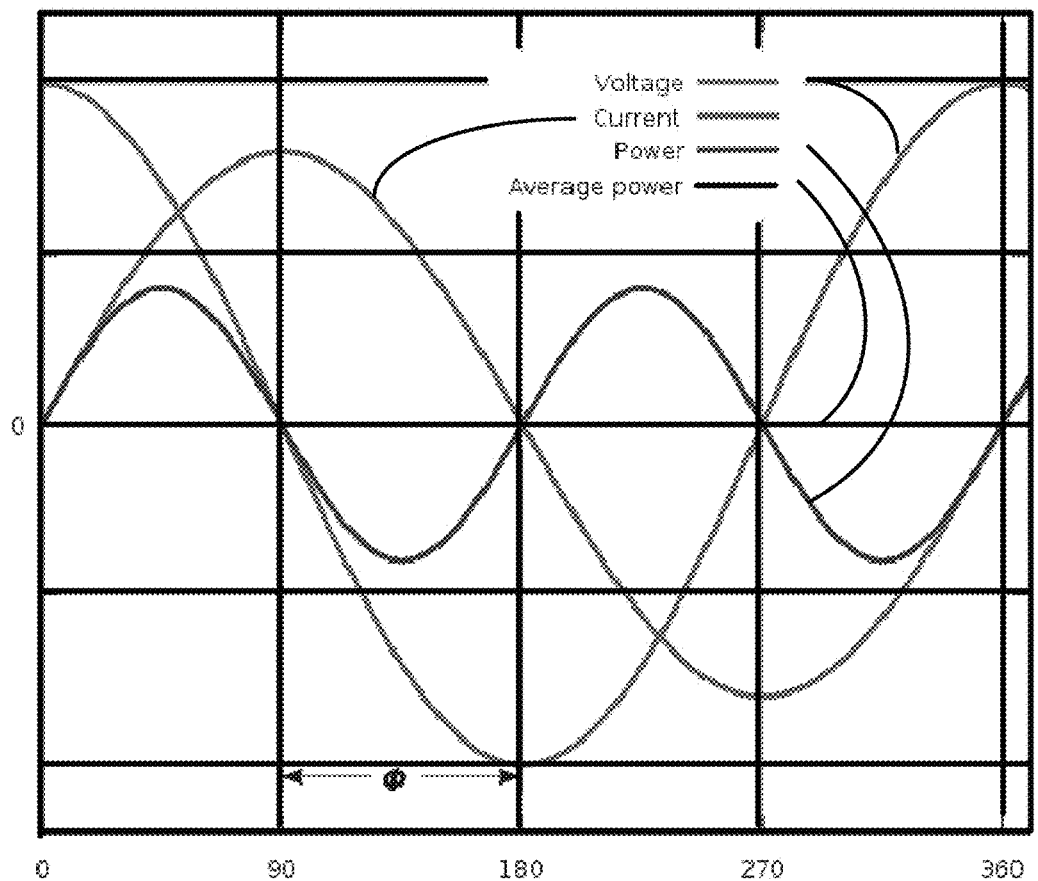
FIG. 13 illustrates a voltage waveform, a current waveform, power calculations, with a power factor of 1.
Figure 14:
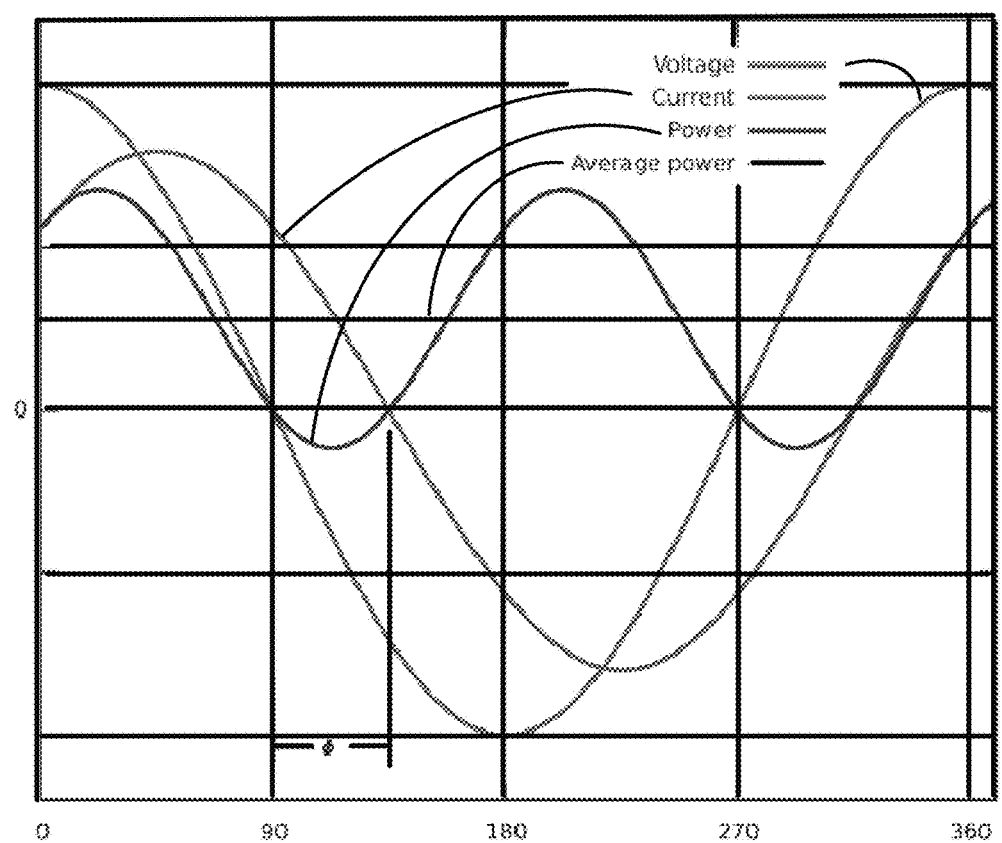
FIG. 14 illustrates a voltage waveform, a current waveform, power calculations, with a power factor other than 1.

Referring to FIG. 13, the power being provided to a load using an alternating current includes both a voltage waveform and a current waveform. A power factor of an electrical system may be defined as the ratio of the real power flowing to the load to the apparent power in the circuit. In a purely resistive alternative current cycle, the voltage and current waveforms are in step, or in phase, changing polarity at the same instant in each cycle. All the power being provided to the load is consumed or otherwise dissipated. In the case of a reactive load, such as with capacitors or inductors, energy stored in the loads results in a phase different between the current and the voltage waveforms. During each cycle of the alternating voltage, excess energy not consumed by the load, is temporarily stored in the load in the electric and/or magnetic fields, and then returned to the power grid a fraction of the period later. In the case of a heating ventilation alternating current distribution systems there is an ebb and flow of non-productive power, where the non-productive power increases the current in the line, potentially to the point of failure. In this manner, a circuit with a low power factor will tend to have higher currents for a given quantity of real power than a circuit with a high power factor. Electrical circuits containing dominantly resistive loads have a power factor of almost 1.0, while circuits containing inductive or capacitive loads tend to have a power factor significantly below 1.0, such as illustrated in FIG. 14. Other techniques may be used to determine and quantify the power factor.

As it may be observed, the temporal relationship may include both a sinusoidal voltage waveform causing a resulting sinusoidal current waveform that is delayed by phase angle or separation φ. For most systems, the phase angle or separation φ between a sinusoidal voltage waveform and its corresponding sinusoidal current waveform tends to be relatively small. In some cases, such as for a lightly loaded electric motor, the phase separation can be substantial, such as greater than 60°. Because in a three-phase system voltages are typically offset relative to each other by ⅓ cycle, or 120°, if a voltage waveform's corresponding current waveform lags by more than 60° (or more than half the distance between two adjacent voltage waveforms), it may become difficult to associate a current waveform with its proper voltage waveform, and thus to correctly determine the phase separation. Any suitable technique may be used to associate each voltage waveform with the corresponding current waveform.

For voltage and/or current waveforms that are not sinusoidal, such as those containing harmonics, the phase separation φ can be determined by the distance between zero crossings (i.e., the points at which the waveforms cross zero). Other characteristics such as corresponding points (such as peaks) may be used to measure the phase separation φ.

The power factor (PF) of a system may include, for example, either apparent power factor or displacement power factor, and can be calculated for sinusoidal waveforms as cos(φ). In other words, for such waveforms, where φ<60°, the power factor is greater than 0.5. Also, when the power factor is 1 there is zero phase separation and the power factor is 0 when power and current are 90° out of phase.

Apparent power factor may be defined as the ratio of real power (P) to apparent power (S). Real power (P) may be the power actually consumed by a load, often called KW (or kilowatts) or W (watts). The apparent power (S), may be referred to as volt-amperes or VA, is the power that is actually sent by a generator to a load for potential consumption, even though some of that power, called reactive power (Q) (often referred to as volt-amperes-reactive, or VAR), may "bounce" back and forth between the generator and load because it is 90° out of phase with the real power (P).

With acceptably high power factors and relatively small phase angle separations, there are at least two ways of determining whether or not an electrical meter is correctly wired to a multi-phase load. First, for each phase, it can be determined whether the phase separation between the voltage waveform and its corresponding current waveform is not more than 60°, and/or whether the power factor is not less than 0.5. Other techniques may likewise be used to determine whether or not a power meter is correctly wired, namely, the corresponding voltage and current waveforms are associated with one another. The system may also determine the degree to which the power factor is appropriate, such as good, fair, and poor.

For example, the power meter may be configured to digitally sample voltages and to record an approximate point (such as time or portion of a cycle) of zero crossings, to digitally sample currents and to record an approximate corresponding point of zero crossings, to determine a distance or separation between these zero crossings, and, if necessary, to convert this separation to an angle. Other techniques of determining phase separation, such as measuring a distance between corresponding points (but not necessarily zero crossings) of the voltage and current waveforms may be used.

The power meter may determine, for each pair of voltage and current sensors, a power factor based at least in part on the voltage waveform and the current waveform sensed by the corresponding pair of voltage and current sensors. This may be performed for a single phase, two phases, and/or three phases of a circuit. In addition, the power metering system may include a plurality of single phase, two phase, and/or three phase circuits, such as illustrated in FIG. 1 through FIG. 6. For example, the power meter may be configured to digitally sample voltages and currents as measured by respective voltage and current sensors, and, for each sample, to multiply the measured voltage and current to obtain a real power. This power is then averaged over all sampled points throughout a complete cycle to arrive at the real power P. Then, because reactive power corresponds to power when current is shifted 90° out of phase with the measured current, the power meter may be configured to shift the sampled current waveform and, for each sample, to multiply the measured voltage and shifted current to obtain a reactive power. This power is then averaged over all sampled points throughout a complete cycle to arrive at the reactive power Q. The power meter may be configured to calculated displacement power factor as $P/\sqrt{(P^2+Q^2)}$. Other techniques for determining the power factor, such as measuring apparent power S and calculating the ratio P/S may be used.

The power meter may further be configured to determine whether or not a determined or calculated parameter meets a predetermined criterion or value. For example, in the case of phase separation for any particular phase, the power meter may be configured to determine if the phase separation φ is not more than 60° (or 45° or 30°). If, for example, the phase separation φ between the voltage and current waveforms measured by the first voltage and current sensors is measured to be 25°, and the first value (i.e., the predetermined criterion applied to the voltage and current waveforms measured by the first voltage and current sensors) is 60°, then the power meter may indicate that the first voltage and current probes are correctly connected (by indicating that the measured phase separation is not more than the first value). This may be performed on a plurality of different phases of one or more circuits to one or more loads.

As another example, in the case of power factor for any particular phase, the power meter may be configured to determine if the power factor is not less than 0.5 (or 0.6 or 0.7 or 0.8 or 0.9). If, for example, the power factor determined by the voltage and current waveforms measured by the first voltage and current sensors is 0.85, and the first value (i.e., the predetermined criterion applied to the voltage and current waveforms measured by the first voltage and current sensors) is 0.5, then the power meter may indicate that the first voltage and current probes are correctly connected (by indicating that the measured power factor is not less than the first value). This may be performed on a plurality of different phases of one or more circuits to one or more loads.

The predetermined criterion or value for each of the phases may or may not be modifiable by a user.

The meter status, as its name implies, has an on state or an off state, where the on state corresponds to an indication that the corresponding criterion or value is satisfied, and where the off state corresponds to an indication that the corresponding criterion or value is not satisfied. For example, in one embodiment, the meter status may be configured to be on only when the phase separation between the voltage and current waveforms measured by the first voltage and current sensors is not more than the first value, such as 45°. As another example, in one embodiment, the meter status may be configured to be on only when the power factor determined by the voltage and current waveforms measured by the third voltage and current sensors is not less than the third value, such as 0.7. As another example, in one embodiment, the meter status may be configured to be on only when one of a plurality of different power factors are not within a particular range. As another example, in one embodiment, the meter status may be configured to be on only when one of a plurality of different power factors are within a particular range.

The meter status, which may be a single or multi-colored light emitting diode(s), lends itself to showing color indications for the power factor. The overall status of the 1, 2, and/or 3 phases may be indicated by the single meter status using one or more colors and/or one or more patterns. The colors may be, for example, red for alarm <0.5 power factor, yellow for warning 0.5 to 0.7 power factor, and/or green for good >0.7 power factor.

In one example, the single meter status blinks once for each active phase and providing information with each blink. Thus there may be a single blink for a single phase, there may be two blinks for two phases, and may be three blinks for three phases. There may be a longer pause followed by a single blink for each active phase, so the blink associated with each phase can be readily determined. The color of the blink may indicates the power factor status for each phase. The single meter status blinks are not necessarily synchronized with the phase status 540 light emitting diodes. For example, in a three phase system, with phase 1 in a low power factor alarm, with phase 2 in a power factor warning, and with phase 3 in a good power factor, the repeating pattern on the single meter status may be, for example: pause—red blink—yellow blink—green blink—pause—red blink—yellow blink—green blink, pause, etc.

In another example, the number of blinks of the meter status may indicate the phase number. The meter status color may indicate the phase status. So in the three phase system with phase 1 in a low power factor alarm, with phase 2 in a power factor warning, and with phase 3 in a good power factor, the repeating pattern on the single meter status may be, for example: pause—red blink—pause—yellow blink—yellow blink—pause—green blink—green blink—green blink—pause—red blink—pause—yellow blink—yellow blink—pause—green blink—green blink—green blink, pause, etc.

By way of example, the three different light emitting diodes of the phase status 540 may illuminate in a synchronous manner. For example, all of the phases may blink their count at the same time (or substantially the same time where the illumination is overlapping with one another) with each of them being the same color. For the phase status 540, the left light emitting diode may be phase 1, the middle light emitting diode may be phase 2, and the right light emitting diode maybe phase 3. Each of the phases may continue to blink the number of times for the phase angle of the corresponding phase, for active phases. For example, the first phase may blink a single green color 7 times for a 70 degree phase angle, the second phase may blink a single green color 6 times for a 60 degree phase angle, and the third phase may blink a single green color 4 times for a 40 degree phase angle. In this manner, by watching one or more cycles, the installer may determine that the first phase has a generally 70 degree phase angle, the second phase has a generally 60 degree phase angle, and the third phase has a generally 40 degree phase angle. With this non-binary indication of the phase angles, a relatively accurate determination may be made of the phase angles for each phase.

By way of another example, the three different light emitting diodes may illuminate in a sequential manner. Only one of the light emitting diodes of the phases is active at any particular point in time to count out the phase angle using the same color. Each of the light emitting diodes for active phases may be illuminated in a sequential manner. For example, the first phase may blink a single green color for the phase angle, then the second phase may blink a single green color for the phase angle, then the third phase may blink a single green color for the phase angle. By way of example, the first phase may blink a single green color 7 times for 70 degree phase angle with the light emitting diodes of the other two phases remaining off, the second phase may blink a single green color 6 times for 60 degree phase angle with the light emitting diodes of the other two phases remaining off, and the third phase may blink a single green color 4 times for a 40 degree phase angle with the light emitting diodes of the other two phases remaining off. In this manner, by watching each of the cycles, in turn, the installer may determine that the first phase has a generally 70 degree phase angle, the second phase has a generally 60 degree phase angle, and the third phase has a generally 40 degree phase angle. With this non-binary indication of the phase angles, a relatively accurate determination may be made of the phase angles for each phase.

Preferably, the light emitting diodes include a minimum of two blinks to provide greater clarity to a measurement, since a power factor of less than 20 degrees may be indicated by a pair of blinks.

In a preferred embodiment, the power factor may be represented as an angle or ratio (in percent), where the power factor is calculated as watts divided by volt-amps, which yields a ratio in the rage from 0 to 1. This may be displayed on the three light emitting diodes of the phase status 540 as a set of increments from 0 to 100% in increments of 10% (one to ten blinks). Preferably, this is displayed on the three light emitting diodes as a set of increments from 0 to 100% in increments of 10% starting at 20% (two to ten blinks). It may be desirable to always show some activity on each phase that is active, so a minimum of two blinks is often preferable.

The meter status may comprise any indicator known in the art that has an easily ascertainable on state and off state, where the on state corresponds to an indication that the corresponding criterion or value is satisfied, and where the off state corresponds to an indication that the corresponding criterion or value is not satisfied (or vice versa). For example, each binary indicator may include a single light bulb, a light emitting diode, or other light-emitting device, where on corresponds to the on state, and off corresponds to the off state; a single light bulb, light emitting diode, or other light-emitting device capable of being illuminated in two colors, where each color corresponds to one of the on and off states; a single light bulb, light emitting diode, or other light-emitting device, that illuminates at two intensities, each intensity corresponding to one of the on and off states; a strobe light that flashes or strobes at two different rates or frequencies, each rate corresponding to one of the on and off states; a speaker that emits a first sound (such as a first pitch or first amplitude), where the on state corresponds to emission of the first sound, and the off state corresponds to the lack of sound emission; a speaker that emits a first sound and a second sound, different in some aspect (such as pitch, amplitude, etc.), where each sound corresponds to one of the on and off states; and so forth. Non-binary indicators may include more than two indicators.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A power meter comprising:
   (a) said power meter including an enclosure having an exterior;
   (b) said power meter capable of receiving a first voltage input signal, a second voltage input signal, and a third voltage input signal representative of voltage levels in a respective first conductor, a second conductor, and a third conductor;
   (c) said power meter capable of receiving a first current input signal, a second current input signal, and a third current input signal, representative of current levels in a respective said first conductor, said second conductor, and said third conductor;
   (d) said power meter determining a first power factor associated with said first voltage input signal and said first current input signal, a second power factor associated with said second voltage input signal and said second current input signal, and a third power factor associated with said third voltage input signal and said third current input signal;
   (e) said power meter including a first phase status observable from said exterior of said enclosure that indicates said first power factor, a second phase status observable from said exterior of said enclosure that indicates second power factor, and a third phase status observable from said exterior of said enclosure that indicates said third power factor.

2. The power meter of claim 1 wherein said first phase status, a second phase status, and a third phase status are respectively illuminated when said first power factor, said second power factor, and said third power factor are respectively less than a respective threshold.

3. The power meter of claim 1 wherein said first phase status, a second phase status, and a third phase status are respectively illuminated when said first power factor, said second power factor, and said third power factor are respectively within a respective range greater than 0 and less than 1.

4. The power meter of claim 1 wherein
   (a) said first phase status, a second phase status, and a third phase status are respectively illuminated with a red color when said first power factor, said second power factor, and said third power factor are respectively less than a respective first threshold;
   (b) said first phase status, a second phase status, and a third phase status are respectively illuminated with a yellow color when said first power factor, said second power factor, and said third power factor are respectively less than a respective second threshold, where said second threshold is greater than said first threshold;

(c) said first phase status, a second phase status, and a third phase status are respectively illuminated with a green color when said first power factor, said second power factor, and said third power factor are respectively greater than a respective third threshold, where said third threshold is greater than said first threshold.

5. The power meter of claim 1 wherein said power meter including a first non-binary said first phase status observable from said exterior of said enclosure that indicates said first power factor, a second non-binary said second non-binary phase status observable from said exterior of said enclosure that indicates said second power factor, and a third non-binary said third phase status observable from said exterior of said enclosure that indicates said third power factor.

6. The power meter of claim 1 wherein said first non-binary phase status blinks in accordance with said first power factor, said second non-binary phase status blinks in accordance with said second power factor, and said third non-binary phase status blinks in accordance with said third power factor.

7. The power meter of claim 6 wherein said first non-binary phase status blinks for each generally 10 degrees of said first power factor, said second non-binary phase status blinks for each generally 10 degrees of said second power factor, said third non-binary phase status blinks for each generally 10 degrees of said third power factor.

8. The power meter of claim 7 wherein each of said first non-binary phase status blinks, said second non-binary phase status blinks, and said third non-binary phase status blinks in a substantially sequential manner.

9. A method of metering an electrical characteristic of a system comprising:
(a) providing an electrical phase checking apparatus, the electrical phase checking apparatus comprising:
   (i) a first voltage sensor;
   (ii) a first current sensor;
   (iii) a first non-binary indicator connected to said first voltage sensor and first current sensor, said first non-binary indicator configured to indicate a phase separation between a voltage waveform measured by said first voltage sensor and a current waveform measured by said first current sensor;
   (iv) a second voltage sensor;
   (v) a second current sensor;
   (vi) a second non-binary indicator connected to second voltage sensor and second current sensor, said second non-binary indicator configured to indicate a phase separation between a voltage waveform measured by said second voltage sensor and a current waveform measured by said second current sensor, wherein the apparatus further comprises a first voltage probe connected to the first voltage sensor, a first current probe connected to the first current sensor, a second voltage probe connected to the second voltage sensor, and a second current probe connected to the second current sensor;
(b) attaching at least two of said probes to at least one wire in said system;
(c) reading a non-binary indication output by at least one of said binary indicators; and
(d) detaching at least one of said at least two of said probes and attaching it to a different wire in said system in response to said reading.

* * * * *

UNITED STATES PATENT AND TRADEMARK OFFICE
CERTIFICATE OF CORRECTION

PATENT NO. : 9,804,211 B2
APPLICATION NO. : 15/185824
DATED : October 31, 2017
INVENTOR(S) : Parker et al.

Page 1 of 1

It is certified that error appears in the above-identified patent and that said Letters Patent is hereby corrected as shown below:

In the Specification

Column 6, Line 65: Delete "strips" and replace with --strip--;

Column 8, Line 27: Delete "neural" and replace with --neutral--;

Column 12, Line 28: Delete "indicates" and replace with --indicate--; and

Column 13, Line 36: Delete "rage" and replace with --range--.

Signed and Sealed this
Twenty-ninth Day of October, 2019

Andrei Iancu
*Director of the United States Patent and Trademark Office*